United States Patent
Nees et al.

(10) Patent No.: US 10,308,768 B2
(45) Date of Patent: Jun. 4, 2019

(54) POLY- OR PREPOLYMER COMPOSITION, OR EMBOSSING LACQUER COMPRISING SUCH A COMPOSITION AND USE THEREOF

(71) Applicant: Joanneum Research Forschungsgesellschaft mbH, Graz (AT)

(72) Inventors: Dieter Nees, Thannhausen (AT); Markus Leitgeb, Fehring (AT); Barbara Stadlober, Graz (AT); Stephan Ruttloff, Weiz (AT); Andre Lintschnig, Graz (AT); Valentin Satzinger, Graz (AT)

(73) Assignee: Joanneum Research Forschungsgesellschaft mbH, Graz (AT)

( * ) Notice: Subject to any disclaimer, the term of this patent is extended or adjusted under 35 U.S.C. 154(b) by 41 days.

(21) Appl. No.: 15/534,392

(22) PCT Filed: Dec. 9, 2015

(86) PCT No.: PCT/AT2015/000157
§ 371 (c)(1),
(2) Date: Jun. 8, 2017

(87) PCT Pub. No.: WO2016/090395
PCT Pub. Date: Jun. 16, 2016

(65) Prior Publication Data
US 2017/0349707 A1 Dec. 7, 2017

(30) Foreign Application Priority Data
Dec. 10, 2014 (AT) .................. A 888/2014

(51) Int. Cl.
| | | |
|---|---|---|
| *C08F 2/46* | (2006.01) | |
| *C08F 2/50* | (2006.01) | |
| *C08G 61/04* | (2006.01) | |
| *C08G 75/045* | (2016.01) | |
| *G03F 7/00* | (2006.01) | |
| *G03F 7/004* | (2006.01) | |
| *G03F 7/027* | (2006.01) | |
| *G03F 7/029* | (2006.01) | |
| *G03F 7/031* | (2006.01) | |
| *G03F 7/075* | (2006.01) | |

(52) U.S. Cl.
CPC ......... *C08G 75/045* (2013.01); *G03F 7/0002* (2013.01); *G03F 7/0046* (2013.01); *G03F 7/027* (2013.01); *G03F 7/029* (2013.01); *G03F 7/0275* (2013.01); *G03F 7/031* (2013.01); *G03F 7/0757* (2013.01)

(58) Field of Classification Search
CPC ..... C08G 75/045; G03F 7/0002; G03F 7/027; G03F 7/029; G03F 7/0757; G03F 7/0046; G03F 7/031; G03F 7/0275
USPC ........... 522/42, 33, 6, 71, 1, 189, 184; 520/1
See application file for complete search history.

(56) References Cited

U.S. PATENT DOCUMENTS

| | | | |
|---|---|---|---|
| 2010/0109317 A1 | 5/2010 | Hoffmuller | |
| 2013/0277890 A1* | 10/2013 | Bowman | C08F 2/00 264/496 |
| 2014/0027739 A1* | 1/2014 | van de Weijer | H01L 51/5256 257/40 |
| 2015/0056421 A1* | 2/2015 | Yudovin-Farber | C09D 11/101 428/201 |
| 2015/0322285 A1* | 11/2015 | Rademacher | C09D 133/14 522/18 |

FOREIGN PATENT DOCUMENTS

| | | | | |
|---|---|---|---|---|
| EP | 2286980 A1 | 2/2011 | | |
| GB | 2003494 A | 3/1979 | | |
| GB | 2089581 | * | 6/1982 | |
| GB | 2089581 A | 6/1982 | | |
| WO | 2007015815 A1 | 2/2007 | | |
| WO | 2009148138 A1 | 12/2009 | | |
| WO | WO-2012057618 A1 * | 5/2012 | ......... H01L 51/5256 |
| WO | WO-2014026142 A1 * | 2/2014 | ............ A61N 5/062 |

* cited by examiner

*Primary Examiner* — Jessica Whiteley
(74) *Attorney, Agent, or Firm* — Duane Morris LLP

(57) ABSTRACT

With a prepolymer composition containing at least one mono or oligomer component with at least one polymerizable C—C double bond as well as at least one multifunctional monomer component, the multifunctional monomer component a multifunctional monomer component is contained with at least two thiol groups selected from the group: 3-Mercaptopropionates, 3-Mercaptoacetates, thioglycolates, and alkylthiols, wherein the mono or oligomer component with at least one polymerizable double bond is selected from the group acrylates, methyl acrylates, vinyl ethers, allyl ethers, propenyl ethers, alkenes, dienes, unsaturated esters, allyl triazines, allyl isocyanates, and N-vinyl amides, and wherein at least one surface-active anti-adhesive additive selected from the group alkyl (meth)acrylates, polysiloxane (meth)acrylates, perfluoroalkyl (meth)acrylates, perfluoropolyether (meth)acrylates, alkyl vinyl ethers, polysiloxane vinyl ethers, perfluoroalkyl vinyl ethers, and perfluoropolyether vinyl ethers, as well as a photoinitiator are contained, as well as the use thereof.

17 Claims, 4 Drawing Sheets

Figure 1:
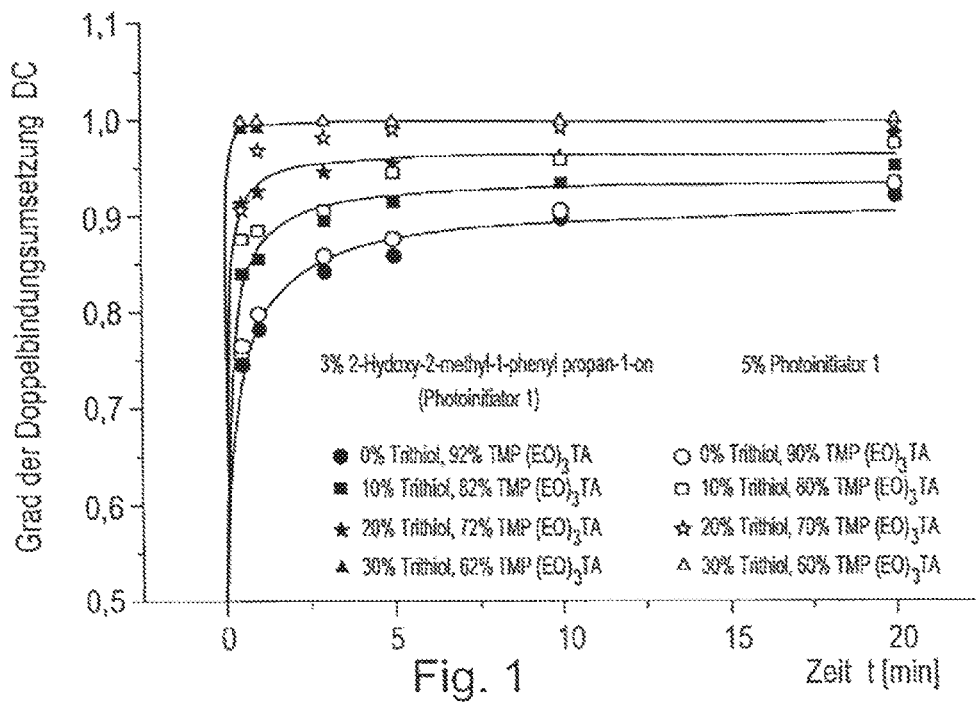

Fig. 7
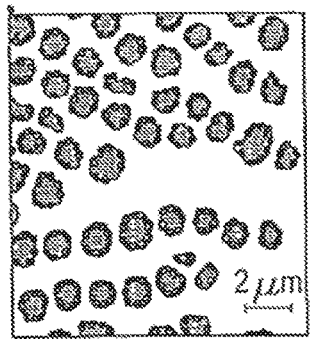
Fig. 7a
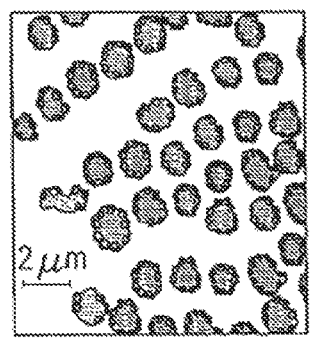
Fig. 7b
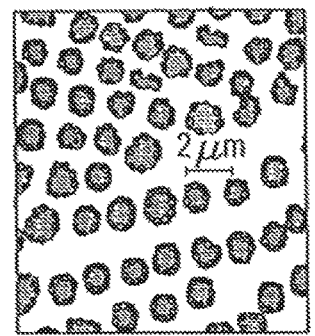
Fig. 7c
Fig. 8
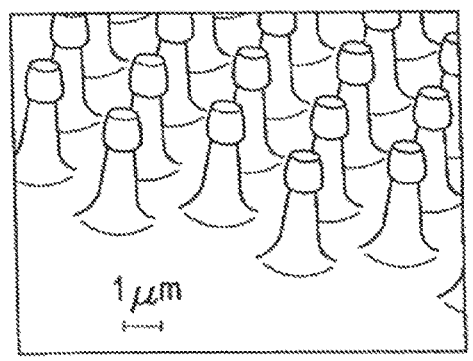
Fig. 8a
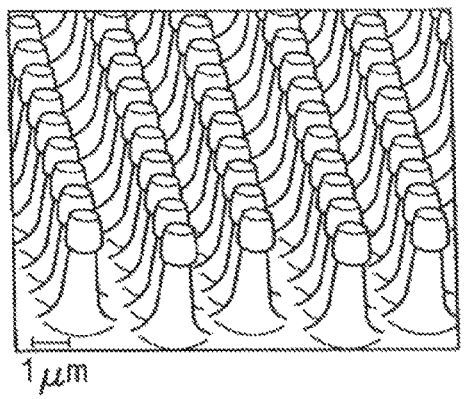
Fig. 8b

POLY- OR PREPOLYMER COMPOSITION, OR EMBOSSING LACQUER COMPRISING SUCH A COMPOSITION AND USE THEREOF

The present invention relates to a prepolymer composition containing at least one mono or oligomer component with at least one polymerizable double bond as well as at least one multifunctional monomer component as well as to a use thereof.

Due to the rapid rise of nanotechnology in recent years, the production of nanostructured components in industrial manufacturing is noticeably gaining in importance, wherein these nanostructured components are typically manufactured from photopolymerizable prepolymer compositions. Finest structures are increasingly used to achieve specific additional functionalities, e.g. self-cleaning of surfaces or even to evoke decorative visual effects or anti-reflection, etc., particularly in safety technology, the area of decor, product marketing, the surface finishing of various materials, and other areas. For this purpose, structures processed through nanotechnology, which are produced from special prepolymer compositions, are used. An even more significant purpose of these micro and nanostructured foils is with electronic, optical, sensory, and magnetic components, such as integrated circuits, displays, micro-optics, etc., as small structural sizes are the decisive factor for the functionality of these elements and, thus, enormous efforts are being made in the field of extensively printed electronics to manufacture components on foil substrates. Thus, for industrial foil manufacturing, micro and nanostructuring techniques, such as roll-to-roll, roll-to-plate or sheet-to-sheet imprint technologies, play an important role and demand ever new and improved moldable foils or compositions, from which these structured foils can be manufactured Industrial foil finishing encompasses a very large area, which ranges from the enhancement of mechanical or decorative surface features to the integration of optical, sensory, and electronic functionalities in the material foil. Particularly the roll-to-roll (R2R), roll-to-plate (R2P), and sheet-to-sheet (S2S) production processes enable a high production speed and a high throughput due to the continuous production method and the large achievable foil formats, through which costs can be reduced and larger production quantities can be provided A crucial criterion and simultaneously a limiting component for the use of these production techniques, however, is the fact that products frequently have structures with dimensions in the lower micrometer or nanometer range—on the one hand due to the high integration density of their individual components as well as to ensure the functionality of the structures in the size of the used wavelength and to enlarge the surfaces overall. While conventional mass printing processes, such as gravure printing, flexographic printing, screen printing, offset printing, etc. enable an extremely high throughput of several 100 meters per minute, they are usually not capable of providing the necessary structural resolution area. They only currently known technology that enables structures to be manufactured with minimal dimensions in the nanometer range in a parallel process is so-called nanoimprint lithography (NIL), which presents a highly precise embossing process and with which it is possible to form even the smallest structures on the respective substrate.

To date, roll-to-roll nanoimprint lithography processes have been used industrially for producing embossed holograms, for example, as counterfeit protection on money. For this purpose, similar processes are used in the nanoimprint lithography process; however, the imprinted structures consist of diffraction grating, wherein a superficial relief is formed. Roll-to-roll nanoimprint lithography processes are used as of late primarily in continuous process, wherein the necessary embossing is ensured by foil tension and contact pressure of the counter roller. Crucial for this method is that adhesion of the embossing lacquer on the imprinting tool is prevented in order to be able to subsequently achieve defect-free demolding of the imprinted object. Currently, two different types of imprinting tools are used for a roll-to-roll nanoimprint process, namely the imprinting profile can either be produced directly on an embossing roller or on thin flexible sheet metal or foil material, which is set firmly around a roller. Currently, so-called shims consisting of nickel are used as these metallic foils that are capable of being arranged around a roller, wherein the production of these nickel shims is relatively complicated. Thus, efforts are being made to replace the nickel shims with embossing stamps consisting of polymer materials, wherein polymer materials potentially have lower surface energies than nickel, which reduces the embossing lacquer adhesion during the imprint process. Moreover, the production costs of polymer embossing stamps are significantly lower, although they have the disadvantage of typically being relatively easily deformable, such that they can only be used to a limited extent as embossing stamps in the submicrometer range. Another disadvantage of polymer materials cross-linking in radical chain reactions in the imprint process is in the fact that suitable materials can typically only be fully cross-linked by precluding oxygen, which seems problematic in a roller process as they do not sufficiently hardened quickly enough to be used in a roller imprint process, and thus their imprint accuracy is relatively minimal, and moreover they are subject to a slow hardening process due to the typically high contained weight proportion of urethane acrylate oligomers, such that a defect-free self-replication of the stamp in a roller process does not seem possible. However, for R2R imprinting, the full conversion of reactive C—C double bonds in the polymer stamp material prior to R2R imprinting is primarily necessary because otherwise they react with the C—C double bonds in the embossing lacquer, which inevitably causes adhesion of the stamp and embossing lacquer.

A form consisting of a molded resin as well as a method for producing this was already revealed in WO 2009/148138 A1, with which robust and simultaneously fine structures can be formed on a surface. A photohardenable resin composition that can be used for developing the form contains a polymerization indicator as well as a respective photopolymerizable monomer.

Thus, the present invention aims to provide a prepolymer composition, with which it is possible to develop producible embossing lacquers from that as well as polymer imprinting tools for roll-to-roll nanoimprint lithography, with which it is possible to not only safely and reliably develop structures in the subnanometer range on the foil surface formed from the prepolymer, but also to print or replicate these numerous times and particularly without separately applying a release material on the imprinting tool to replicate and print.

To achieve this goal, a prepolymer composition according to the invention is primarily distinguished by the fact that the multifunctional monomer component contains a multifunctional monomer with at least two thiol groups selected from the group: 3-Mercaptopropionates, 3-Mercaptoacetates, thioglycolates, and alkylthiols, wherein the mono or oligomer component with at least one polymerizable double bond is selected from the group of acrylates, methyl acrylates, vinyl ethers, allyl ethers, propenyl ethers, alkenes, dienes, unsaturated esters, ally triazines, allyl isocyanates, and N-vinyl amides, and wherein at least one surface-active anti-adhesive additive selected from the group of alkyl (meth)acrylates, polysiloxane (meth)acrylates, perfluoroalkyl (meth)acrylates, perfluoropolyether (meth)acrylates, alkyl vinyl ethers, polysiloxane vinyl ethers, perfluoroalkyl vinyl ethers, and perfluoropolyether vinyl ethers, as well as one photoinitiator are contained.

Due to the fact that—according to the invention—the mono or oligomer component with at least one polymerizable double bond is selected from the group of acrylates, methacrylates, vinyl ethers, allyl ethers, propenyl ethers, alkenes, dienes, unsaturated esters, ally triazines, allyl isocyanates, and N-vinyl amides, a rapid reaction with radical oxygen molecules occurs with a radical polymerization initiated by the photoinitiator. The peroxy radicals occurring during this reaction are very inert and do not react with carbon-carbon double bonds. For this reason, each oxygen molecule causes a termination of a polymerization chain reaction during radical polymerization, which is not desirable. However, in the presence of a multifunctional monomer component having at least two thiol groups, the peroxy radicals abstract hydrogen atoms from the thiol groups while forming thionyl radicals, which in turn added to the carbon-carbon double bonds and initiate a polyaddition reaction. The polyaddition induced by the thiols thus continues the UV cross-linking. Due to the simultaneous growth of many reaction centers, gelation only occurs in very high conversions, e.g. compared to pure acrylate systems, through which the growing molecules remain movable longer, which leads to overall higher polymerization speeds and high conversion rates. At the same time, a more consistent cross-linking and fewer stresses are achieved within the polymer due to the generation of several reaction centers, and a highly reduced contraction of the material is likewise achieved during solidification.

In addition to the presence of a photoinitiator, it is beneficial for the execution of the polymerization to additionally use at least one mono or oligomer component with at least one polymerizable double bond, which is selected form the group of acrylates, methacrylates, vinyl ethers, allyl ethers, propyl ethers, alkenes, dienes, unsaturated esters, allyl triazines, allyl isocyanates, and N-vinyl amides, as well as to add a surface-active anti-adhesive additive in order to thereby reduce the adhesion energy, i.e. the adhesion between embossing lacquer formed from the prepolymer composition and the shim or the stamp, which enables a residue-free removal of the two materials.

Due to the fact—as corresponds to a design of the invention—that the prepolymer composition is formed in such a way that the multifunctional monomer component with at least two thiol groups is contained in a quantity of 1 wt % to 50 wt %, particularly 5 wt % to 30 wt %, and that two of at least the one polymerizable double bond having mono or oligomer components are contained in a total quantity of 1 wt % to 90 wt %, particularly 10 wt % to 50 wt %, on the one hand, the contraction occurring with every polymerization is already caused through the targeted use of the quantity of the multifunctional monomer component having at least two thiol groups, through which the mold accuracy is considerably enhanced compared to conventional materials in a subsequent UV imprint process. Thus, specifically the prepolymer compositions according to the invention have considerably reduced contraction in the fully cross-linked state compared to conventional polymers.

Furthermore, due to the fact that two of at least the one polymerizable double bond having mono or oligomer components are contained in a total quantity of 1 wt % to 90 wt %, particularly 10 wt % to 50 wt %, the polymerization speed can be specifically controlled. The two utilized mono or oligomer components having at least one polymerizable double bond differ here particularly in their molecular weight. For example, one of the two mono or oligomer components having at least one polymerizable double bond can be a reactive monomer and the other can be an oligomer component, through which the material properties of a hardened polymer produced thereof can be specifically set. Thus, an increase of the share of one of the two mono or oligomer components having a polymerizable double bond results in a lowering of the polymerization speed due to the reduced mobility or flexibility of the mono or oligomer components. In contrast, an elongation of lateral chains leads to a significant increase of the polymerization speed and thus to increased conversion due to the increased mobility or flexibility of the mono or oligomer components. Through the targeted selection of the utilized quantity of the two main components of the prepolymer composition, for example, a polymer composition, such as an embossing lacquer, can therefore be formed, which has an extremely high mold accuracy with simultaneously reduced contraction and greater stability.

Due to the fact—as corresponds to a design of the invention—that urethane acrylate oligomers with a molecular weight between approx. 300 g/mol and 2500 g/mol are used as a mono or oligomer component with at least one polymerizable double bond, it is possible to specifically provide a prepolymer composition, which allows a consistent layer thickness to be achieved, which is free of irregularities, for a subsequent coating or application of the polymer layer compared to conventional layers. This prepolymer composition has easily processable viscosities. Specifically, for example, urethane acrylate oligomers or polyester oligomers have a high viscosity and these viscosities impede or prevent the consistent application of a thin layer of prepolymer composition by means of gravure printing or other coating process, such as inkjet or slit coating. Therefore, to ensure that on the one hand the viscosity is not too high and on the other hand the layer thicknesses do not become too great or, in particular, uneven, the approach according to the invention is that, for example, acrylate monomers or vinyl ester monomers are added to the urethane acrylate oligomers with a higher molecular weight as so-called reactive thinners in order to achieve even layer thicknesses and, in particular, to not raise the viscosity too much.

According to the design of the invention, it has proved to be beneficial here to proceed in such a way that the mono or oligomer components with at least one polymerizable double bond are selected from the group of the bifunctional urethane acrylate oligomers with a molecular weight between 300 g/mol and 1200 g/mol, trifunctional urethane acrylate oligomers with a molecular weight between 450 g/mol and 1750 g/mol, and tetrafunctional urethane acrylate oligomers with a molecular weight between approx. 500 g/mol and 2500 g/mol in order to keep the viscosity of the prepolymer composition as low as possible and to enable a consistent application of thin layers. Due to this selection of molecular weights in relation to the functionality of the urethane acrylate oligomers, it is also possible to ensure the sufficiently rapid flow of the prepolymer into the stamp topography, through which particularly even extremely small structures can be safely and reliably molded.

Due to the fact—as corresponds to a design of the invention—that the surface-active anti-adhesive additive contains a quantity of 0.01 wt % to 10 wt %, particularly 0.1 wt % to 3 wt %, this ensures that the surface energy of the prepolymer composition is reduced to such an extent that additional generations of patterns can be repeatedly drawn through imprinting or molding without defects. The surface energy of these embossing lacquers is not insignificantly impacted here by the surface energy of the adjacent phase, wherein it applies that the lower the surface energy of the adjacent phase is, the lower the surface energy of a polymer imprinted from the prepolymer composition is and the better are the anti-adhesive properties thereof. This low surface energy of the imprint master propagates in an embossing stamp formed in this manner and can also be maintained throughout multiple moldings.

Due to the fact—as corresponds to a design of the invention—that the photoinitiator contained in the prepolymer composition is selected from the group of thioxanthones, ketosulfones, (alkyl) benzoyl phenyl phosphine oxides, 1-Hydroxy alkyl phenyl ketones or 2,2Dimethoxy-1,2-diphenyl ethane-1-one, it is possible to effectively initiate the polymerization.

Due to the fact—as corresponds to a design of the invention—that the photoinitiator is contained in a quantity of 0.1 wt % to 10 wt %, particularly 0.5 wt % to 5 wt %, the polymerization speed of the composition can be specifically controlled. In general, it can be stated that the higher the concentration of the photoinitiator is, the greater the polymerization speed is in the utilized thin layers, such that particularly a quantity in the lower range of 0.5 wt % to 5 wt % of the photoinitiator has proved to be beneficial for a polymerization according to the invention.

The higher the mass portion is of, for example, a urethane acrylate oligomer, the greater is the hardness of the final polymer composition, and thus this demonstrates that it is frequently necessary within the scope of the present invention, particularly for adjusting, e.g. the viscosity, to add a reactive thinner to the modulus of elasticity, the indentation hardness, etc., wherein—as is preferred according to the invention—the reactive thinner is selected from the group of aliphatic (meth)acrylates or polyether(meth)acrylates, particularly HDDA, PEODA or TMP(EO)$_x$TA. It has proved here that the arm length of the thinner has a considerable impact on the hardness of the polymer composition. Wth an increasing share of reactive thinner and particularly due to the fact that a multifunctional aliphatic or polyether(meth) acrylate, particularly TMP(EO)$_9$TA, TMP(EO)$_6$TA, TMP(EO)$_3$TA or TMPTA is contained as a reactive thinner, the hardness of the polymer composition can be specifically impacted here in addition to the viscosity of the prepolymer composition. Here, for example, the use of TMP(EO)$_9$TA leads to a strong reduction of the hardness of the polymer composition, whereas the use of TMP(EO)$_3$TA leads to a considerably less reduction of the hardness of the polymer composition, such that the hardness of the final product can be specifically controlled through the targeted selection of the reactive thinner.

The compound designated with the non-nomenclature "trithiol" involves trimethylolpropane tris-(3-mercaptopropionate).

Due to the fact—as corresponds to a design of the invention—that the prepolymer composition has a viscosity of 0.01 Pas to 1 Pas, a good fluidity of the prepolymer composition is achieved, such that not only a uniform coating of surfaces to be molded is achieved, but this also ensures that the prepolymer composition flows sufficiently rapidly in order to completely fill the indentations of very fine patterns with adequate speed.

To keep an adherence of the prepolymer composition on surfaces, for example, a nickel shim surface as minimal as possible or to fully prevent this, the invention has been designed in such a way that an additive containing silicon or fluoride selected from the group of mono or polyfunctional polydimethylsiloxane (meth) acrylates, perfluoro-n-alkyl (meth) acrylates or perfluoropolyether (meth) acrylates in a quantity of 0.1 wt % to 3 wt % is additionally contained as a surface-active anti-adhesive additive. Additives containing silicon or fluoride contribute the reduction of adhesion and the simplification of removal of the polymer compositions formed from the prepolymer composition from the imprinting tool, wherein particularly perfluorinated additives have proven to be particularly beneficial and reliably enable a multitude of moldings of a pattern.

Furthermore, the invention aims to use the prepolymer composition according to the invention to form an embossing lacquer. These embossing lacquers are particularly well suited for use in roll-to-roll, roll-to-plate or sheet-to-sheet processes and demonstrate excellent molding properties, such that they can be used on an industrial scale. A particularly high number of cycles in an imprint process can be achieved according to the invention through the use of the prepolymer composition, which is distinguished by the fact that the hardened prepolymer composition has a modulus of elasticity between 50 MPa and 5 GPa and a surface energy of 10 to 60 mJ/cm$^2$. Embossing lacquers, which have a modulus of elasticity between 50 MPa and 5 GPa, are adequately solid and sufficiently flexible and demonstrate sufficiently low adhesion energies to be repeatedly molded without fearing an impact, particularly a distortion of the pattern. Due to the potential extremely low surface energy and, therefore, adhesion energy, it is also possible to conduct multiple generations of imprints and moldings without damage occurring due to adhered embossing lacquer.

Finally, the invention aims to use the prepolymer composition for continuous structuring and in situ UV hardening in a roll-to-roll imprint process as well as to produce self-moldable embossing stamps for UV imprinting of largely identical polymers. Even if comparable prepolymer compositions have already been used in other technical fields, we were surprisingly able to demonstrate that in situ embossing lacquers can be formed from a prepolymer composition for a roll-to-roll imprint process, with which a multitude of moldings can be achieved without damage to the printing pattern and particularly accurate moldings of nanostructured topographies.

Furthermore, it is possible—as corresponds to a design of the invention—to use the prepolymer composition as a self-moldable embossing stamp for pre-imprinting largely identical embossing lacquers.

Figure 2:
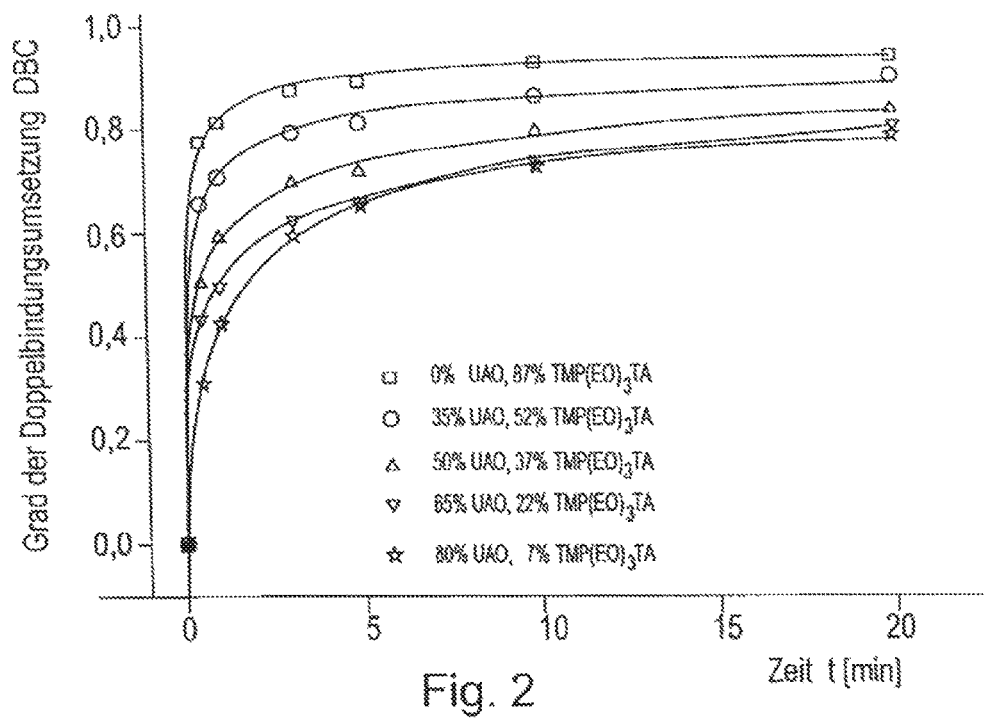
Figure 3:
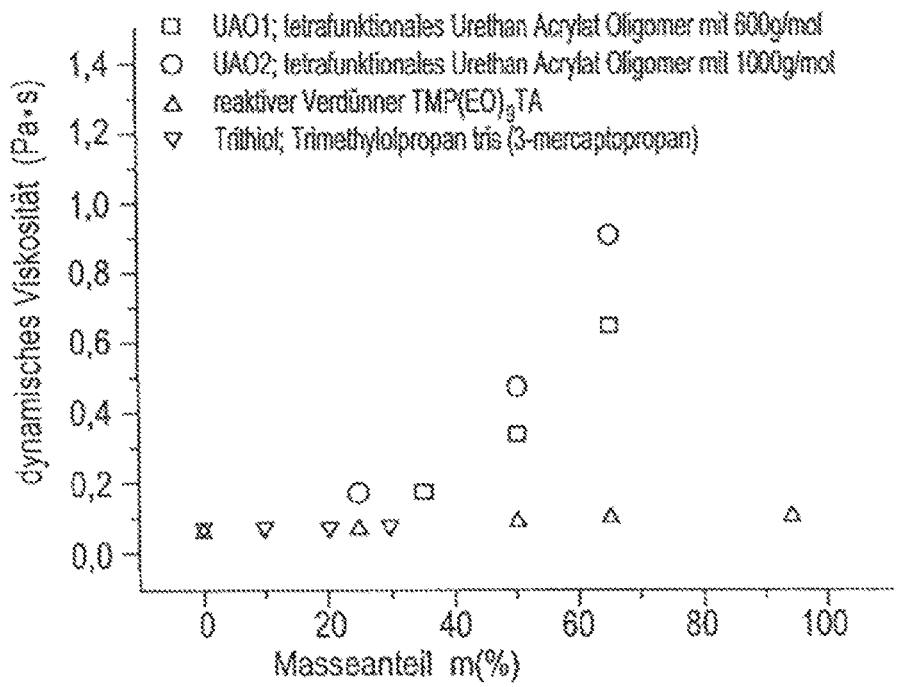
Figure 4:
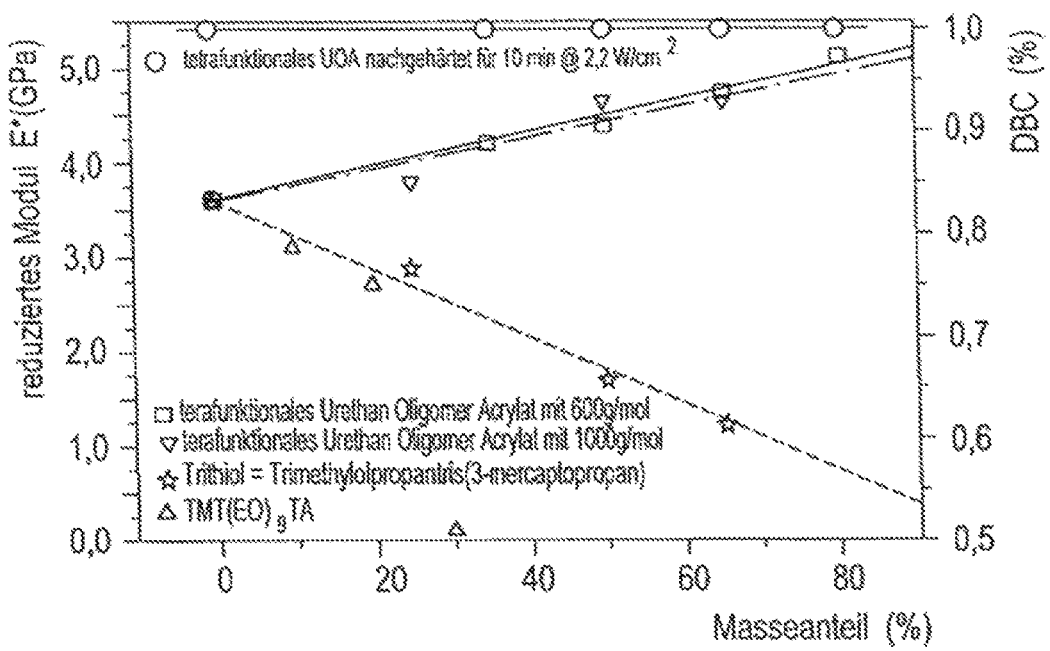
Figure 5:
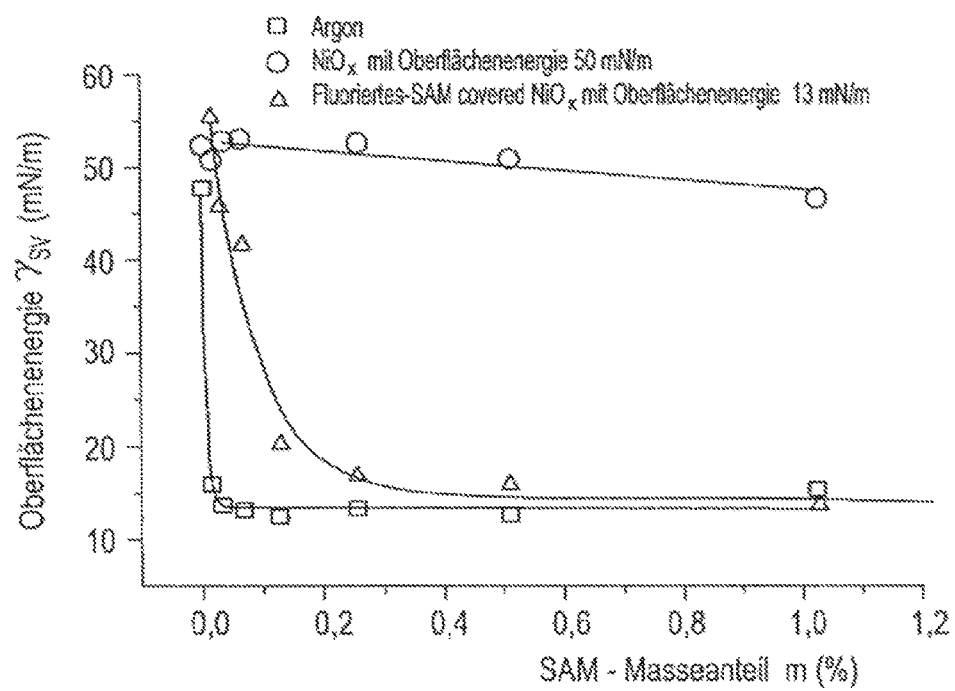
Figure 6A:
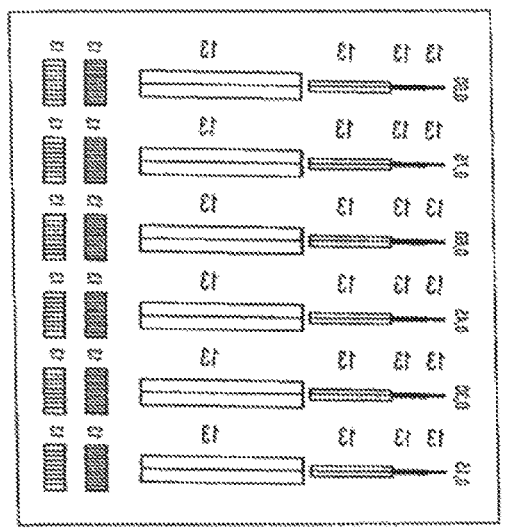
Figure 6B:
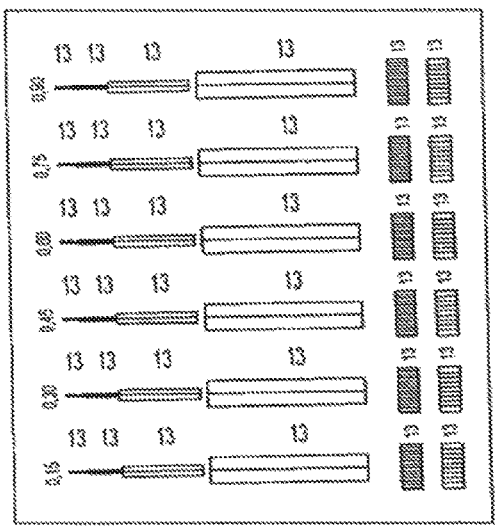

The invention will be explained in further detail below based on design examples as well as drawings. The following are shown there:

FIG. 1 a diagram, which shows the impact of the quantity of the multifunctional monomer component with at least two thiol groups on the conversion of the C—C double bonds in relation to the time for hardening of the prepolymer composition through UV irradiation, FIG. 2 an analogous diagram as in FIG. 1, which shows the impact of the quantity of the mono or oligomer component on the conversion of the C—C double bonds in relation to the time for hardening of the prepolymer composition through UV irradiation, FIG. 3 a diagram, which shows the impact of the components of the prepolymer on the dynamic viscosity of the prepolymer, FIG. 4 a diagram, which shows the curve of the module of elasticity in relation to the concentration of individual components of the prepolymer, FIG. 5 the change of surface energy of the prepolymer composition in relation to the quantity of the utilized anti-adhesive additive, and FIGS. 6, 7 and 8 examples for the self-replication of embossing lacquers, which were produced based on the prepolymer composition according to the invention, wherein FIG. 6 shows urethane acrylate polymer stamp molded from a nickel master (FIG. 6*a*) and a polymer imprint (FIG. 6*b*) conducted therewith, FIG. 7 shows an analogous depiction, in which FIG. 7*a* shows a urethane acrylate master, FIG. 7*b* shows the urethane acrylate embossing stamp molded from that, and FIG. 7*c* shows the embossing lacquer produced with the foil in a urethane acrylate embossing lacquer on a foil, and FIG. 8 shows an example of the transfer of three-dimensional structures with a urethane acrylate embossing stamp according to the invention, wherein FIG. 8*a* shows the silicon imprinting master and FIG. 8*b* shows the imprint produced by means of a urethane acrylate polymer roller stamp in the roll-to-roll UV imprint process on foil.

Example 1 shows the impact of the addition of a multifunctional monomer component with at least two thiol groups on polymerization kinetics.

Specifically, varying quantities of trithiol (trimethylolpropane tris (3mercaptopropionate)), were respectively added to a prepolymer matrix containing 4.5% of a tetrafunctional urethane acrylate oligomer (UAO), 0.5% of an anti-adhesive additive, polydimethylsiloxane, 3% or 5% of a photoinitiator, i.e. 2-Hydroxy-2-methyl-1-phenyl propane-1-one as well as a reactive thinner TMP(EO)$_3$TA. With an increasing proportion of trithiols, the content of reactive thinner TMP(EO)$_3$TA reduces to the same degree. As is clearly evident in FIG. 1, the reaction kinetics is considerably accelerated the higher the share of trithiol. Furthermore, it is evident in FIG. 1 that the greater the content of trithiol is, the higher the content of unconverted double bonds is. Finally, it is evident in FIG. 1 that a complete conversion of all C—C double bonds has already occurred after a few seconds with a trithiol content of 30% and that an increase of the proportion of photoinitiator from 3% to 5% likewise leads to an acceleration of polymerization.

Thus, the higher the shares of trithiol or shares of multifunctional monomer components having at least two thiol groups are in the prepolymer composition, the faster the complete conversion of C—C double bonds is, wherein these prepolymer compositions can be used, e.g. as embossing lacquers (imprint embossing lacquers). An incomplete conversion of C—C double bonds in the short exposure time available of <1 s, with, e.g. 2 W/m$^2$ in an R2R imprint process would cause sticky surface, through which a separation of the embossing lacquer from the stamp does not seem possible and, for example, the embossing lacquer may adhere to the stamp. The addition of multifunctional monomer components with at least two thiol groups enables such a rapid conversion of the C—C double bonds that the embossing lacquers can be used in a continuous roll-to-roll UV nanoimprint lithography process. An increase of the portion of urethane oligomer acrylate in a prepolymer matrix consisting of 9.5% trithiol, 0.5% polymethyl siloxane as an anti-adhesive additive, 3% 2-Hydroxy-2-methyl-1-phenyl propane-1-one as a photoinitiator, and TMP(EO)$_3$TA as a residue-reactive thinner leads to a deceleration of polymerization kinetics, as can be recognized in FIG. 2. The higher the share of the urethane acrylate oligomer, i.e. the mono or oligomer component with at least one polymerizable double bond, the slower the polymerization kinetics become, which can be explained with an increase in viscosity and thus a reduction of the mobility of radicals. The consequence of this is a more rapid achievement of the gel point, a lower conversion rate, and finally a lower yield rate. It is evident in FIGS. 1 and 2 that a prepolymer composition must have a highest possible share of multifunctional monomer components with at least two thiol groups for the use as an imprint embossing lacquer. The following prepolymer composition is mentioned here as an example: 20% trithiol, 35%<x<60% UAO, (74.5-x) % TMP(EO)$_3$TA, 5% photoinitiator, and 0.5% of an anti-adhesive additive, which distinguishes itself through a complete conversion and thus produced embossing lacquers are distinguish by a particularly high scratch embossing lacquerance.

Example 2

A prepolymer mixture consisting of a urethane acrylate oligomer, reactive thinner, photoinitiator, and multifunctional monomer component with at least two thiol groups, particularly trithiol as well as a photoinitiator, was studied with respect to the change of viscosity by analyzing the impact of the chain length of the oligomer component with at least one polymerizable double bond for viscosity, the concentration of the monomer component with at least two thiol groups for viscosity, as well as of the reactive thinner for viscosity. As can be seen in FIG. 3, the dynamic viscosity increases in relation to the chain length of the oligomer component with at least two polymerizable double bonds. From this test, we can see that the higher the share of the oligomer component is, the higher the viscosity of the prepolymer system is. Because it is beneficial for a roll-to-roll process if the prepolymer composition has a dynamic viscosity of less than 1.0 Pas—and it has proved in other tests that smooth, consistently thick layers can be achieved when using these prepolymer compositions. It is natural that the lower the viscosity of the embossing lacquer is, the more easily complicated structures of the imprint relief in the stamp can be sufficiently rapidly filled during a roll-to-roll imprint process and subsequently precisely transferred.

FIG. 3 reveals that an optimal prepolymer composition for an embossing lacquer or an embossing stamp material has a share of less than 60% of urethane acrylate oligomer with a molecular weight<1000 g/mol and that the concentration of other components, such as anti-adhesive additive, multifunctional monomer components with at least two thiol groups, photoinitiator, as well as the type of reactive thinner only have a minimal impact on the viscosity.

Example 3 shows how the mechanical strength, i.e. the reduced Young's modulus of elasticity* of the tetrafunctional UAO changes with 600 g/mol after exposure, i.e. cross-linking with through 1 min. of pre-hardening at 5 mW/cm$^2$ with the Waldmann UV source and final hardening for 1 min. at 2.2 W/cm$^2$ depending on the composition.

As can be seen in FIG. 4, the modulus of elasticity increases with an increase of the share of the oligomer component with at least one polymerizable double bond, such as a tetrafunctional urethane acrylate oligomer with different molecular weights between 600 g/mol to 1000 g/mol, in a prepolymer matrix consisting of (96.5-x) % TMP(EO)$_3$TA, wherein x is the quantity of the oligomer component with at least one polymerizable double bond or TMP(EO)$_9$TA or trithiol, as well as 3% of 2-Hydroxy-2-methyl-1-phenyl propane-1-one is used as a photoinitiator and 0.5% of polydimethylsiloxane acrylate is used as an anti-adhesive additive. The maximum elasticity* values are at 5 GPa with a concentration of 80% urethane acrylate oligomer, wherein the increase of the modulus of elasticity arises from the fact that the oligomers have a higher number of cross-linkable acrylate groups.

Table 1: Similarly, it is shown that the modulus of elasticity of the hardened polymer decreases if the side arm length—i.e. the number of ethoxy groups—of the monomer components with at least one polymerizable double bond used as reactive thinners selected from TMPTA, TMP(EO)$_3$TA, TMP(EO$_6$)TA, and TMP(EO$_9$)TA increases, as can be seen in the following table. Furthermore, we can see from this table that the higher the molecular weight—i.e. the side are length—or the number f ethoxy groups—of the reactive thinner is, the greater the degree of conversion is of the double bonds, wherein the thinner was respectively introduced in a quantity of 65% of the total prepolymer composition. The polymer was hardened for 1 minute at 5 mW/cm$^2$.

TABLE 1

| 100% | DBC(%) | E*[MPa] |
|---|---|---|
| TMPTA | 61 | 1701 |
| TMP(EO)$_3$TA | 77 | 1340 |
| TMP(EO)$_6$TA | 94 | 404 |
| TMP(EO)$_9$TA | 98 | 129 |

The result of the test in Example 3 is a decrease of the modulus of elasticity when trithiol is added, which largely relates to the lowering of the glass transition temperature during thiol polymerization—addition of trithiol.

Thus, 5% trithiol, 35≤x≤60% UOA, (89.5-x) % TMP(EO)$_3$xTA, 5% photoinitiator, and 0.5% of an anti-adhesive additive emerges as an ideal composition of a prepolymer for an embossing stamp with a high degree of hardness and 100% conversion through subsequent hardening. A rapid cross-linking is not so necessary for producing the embossing stamp because it is possible to imprint significantly slower in this case and subsequent hardening is also possible.

A second ideal composition for the embossing lacquer with a nearly complete conversion would be: 5% trithiol, 35≤x≤60% UAO, (89.5-x) % TMP(EO)$_9$TA, 5% photoinitiator, and 0.5% of an anti-adhesive additive, wherein no subsequent hardening is necessary.

Example 4 shows the impact of the quantity of an anti-adhesive additive on the surface energy of the prepolymer.

As can be seen in FIG. 5, the surface energy of the prepolymer can be extremely reduced during its hardening against air/argon by adding a perfluoropolyether acrylate (HFPO-A) as an anti-adhesive additive of concentrations that are less than 1%. In contrast, it is evident that if the hardening of the prepolymer occurs with respect to an untreated nickel surface, the high surface energy of the nickel in the embossing lacquer is "copied", and despite the addition of an anti-adhesive additive no significant degradation of the surface energy of the imprinted polymers is achieved. On the other hand, if the hardening occurs during imprinting with respect to nickel surface treated with a fluorinated self-assembling alkyl monolayer, the lower surface energy of this monolayer will be copied and in turn the surface energy of the imprinted, hardened polymer is lowered, as can likewise be seen in FIG. 5.

Thus, we recognize that the addition of anti-adhesive additives to a prepolymer composition, any composition in a concentration between 0.1% and 0.5% occurs to a significant lowering of the surface energy when hardening with respect to a low-energetic surface, such that a defect-free demolding of the hardened polymer is enabled.

Example 5

Self-replications of prepolymer compositions based on a mono or oligomer component with at least one polymerizable double bond and at least one multifunctional monomer component having at least two thiol groups.

The prepolymer compositions demonstrate excellent self-replicability, particularly in a roll-to-roll nanoimprint lithography process. To ensure that this self-replicability is present, the polymer stamp embossing lacquer must be completely hardened, i.e. completely CONVERTED. In FIG. 6, a polymer stamp based on a urethane acrylate oligomer is molded from a nickel master (FIG. 6a) and roll-to-roll molding is then conducted form that (FIG. 6b), from which we recognize that FIG. 6b represents a mirror image of FIG. 6a.

The replication of irregular and undercut 3D structures is depicted in FIG. 7, wherein the depicted figures are diatom structures. Here, FIG. 7a shows the urethane acrylate master; FIG. 7b shows urethane acrylate oligomer embossing stamp on foil molded from that, and FIG. 7c shows an imprint produced with the stamp from FIG. 7b by means of a roll-to-roll process in a urethane acrylate oligomer embossing lacquer according to the invention.

FIG. 8 shows that the transfer of 3D structures with undercuts with a high aspect ratio, such as in silicon-etched pillar structures in the urethane acrylate oligomer embossing lacquer is possible in roll-to-roll process. The positive Si master is shown here in FIG. 8a. A negative urethane acrylate oligomer embossing stamp was produced from this Si master and in FIG. 8b, the imprint produced with this embossing stamp in a roll-to-roll UV nanoimprint lithography process (R2R-UV-NIL) is depicted.

Here, FIGS. 6 to 8 are electron microscopic images from linear structures with a distance of 400 nm and a width of 600 nm, which were transferred into the urethane acrylate oligomer embossing lacquer in an R2R process at a speed of 10 m/min.

Example 6

Manufacturing of Water and Dirt-Repellent Polymer Foils

The production of water-repellent and dirt-repellent or self-cleaning polymer foils with prepolymer compositions containing 10 wt % of 90 wt % of a mono or oligomer component with at least one polymerizable double bond, particularly low-viscous, multifunctional, aliphatic polyurethane acrylates, 10 wt % to 90 wt % of a multifunctional, reactive thinner selected from the aforementioned group, 1 wt % to 10 wt % of a photoinitiator, particularly 2-Hydroxy2-methyl-1-phenyl propane-1-one and 0.1 wt % to 3 wt % of a surface-active anti-adhesive polymer, particularly 1H,1H, 2H,2H-Tridecafluoroctyl acrylate, embossing lacquers having an extremely low surface energy of 12 mJ/m$^2$ can be produced from the prepolymer composition. Because the surface additive is absorbed very efficiently on the embossing lacquer surface, it forms a dense monolayer with a high share of CF$_3$, through which it is possible to produce foils, which—if an imprinting tool with a respectively reduced surface energy is simultaneously used, such as nickel stamp surfaces or silicon or quartz surfaces, as a stamp, which are respectively coated with long-chain active perfluoroalkyl phosphonic acids, such as 1H,1H, 2H,2H-Tridecafluoroctyl phosphonic acid—provide a stamp material, which likewise has a low surface energy of 12 mJ/m$^2$. To further reduce the water/polymer contact surface, which must be as small as possible for a water-repellent or dirt-repellent effect, the embossing lacquer surface is subsequently micro or nanostructured, through which the contact angle can be raised with water to more than 170° with a simultaneously very low contact angle hysteresis and the slope angle of water droplets can be reduced to <2°. It is noted simply for comparison that smooth surfaces of the embossing lacquer have a contact angle of approx. 115° with water, such that the water-repellent effect can only be achieved with a strong tendency of the foil itself, whereas water cannot adhere to a nearly level surface either in the case of a structured foil.

What is claimed is:

1. A prepolymer composition containing at least one monomer or oligomer component having at least one polymerizable C—C double bond as well as at least one multifunctional monomer component, wherein the multifunctional monomer component contains at least two thiol groups selected from the group consisting of: 3-Mercaptopropionates, 3-mercaptoacetates, thioglycolates, and alkyl thiols, wherein the monomer or oligomer component having at least one polymerizable double bond is selected from the group consisting of acrylates, methyl acrylates, vinyl ethers, allyl ethers, propenyl ethers, alkenes, dienes, unsaturated ester, allyl triazines, allyl isocyanates, and N-vinyl amides, and wherein at least one surface-active anti-adhesive additive selected from the group consisting of alkyl-(meth) acrylates, poly-siloxane (meth)acrylates, perfluoroalkyl (meth)acrylates, perfluoropolyether (meth)acrylates, alkyl vinyl ethers, polysiloxane vinyl ethers, perfluoroalkyl vinyl ethers, and perfluoropolyether vinyl ethers, as well as one photoinitiator are included, wherein the multifunctional monomer component having at least two thiol groups is contained in a quantity of 5 wt % to 30 wt %, the two monomer or oligomer components having at least one polymerizable double bond are contained in a total quantity of 10 wt % to 50 wt %, and the surface-active anti-adhesive additive is contained in a quantity of 0.1 wt % to 3 wt %.

2. The prepolymer composition according to claim 1, wherein a urethane acrylate oligomer with a molecular weight between approximately 300 g/mol and 2500 g/mol is used as a monomer or oligomer component having at least one polymerizable double bond.

3. The prepolymer composition according to claim 2, wherein the monomer or oligomer components having at least one polymerizable double bond are selected from the group consisting of bifunctional urethane acrylate oligomers with a molecular weight between 300 g/mol and 1200 g/mol, trifunctional urethane acrylate oligomers with a molecular weight between 450 g/mol and 1750 g/mol, and tetrafunctional urethane acrylate oligomers with a molecular weight between approximately 500 g/mol and 2500 g/mol.

4. The prepolymer composition according to claim 1, wherein the photoinitiator is selected from the group consisting of thioxanthones, ketosulfones, (alkyl-)benzyl phenyl phosphine oxides, 1-Hydroxy alkyl phenyl ketones or 2,2-Dimethoxy-1,2-diphenyl-ethan-1-on.

5. The prepolymer composition according to claim 4, wherein the photo-initiator is contained in a quantity of 0.1 wt % to 10 wt %.

6. The prepolymer composition according to claim 1, wherein at least one monomer component having at least one polymerizable double bond is a reactive thinner.

7. The prepolymer composition according to claim 6, wherein the reactive thinner is selected from the group consisting of aliphatic (meth)acrylates or polyether (meth) acrylates.

8. The prepolymer composition according to claim 7, wherein at least one multifunctional aliphatic or polyether (meth)acrylate is contained as a reactive thinner.

9. The prepolymer composition according to claim 1, wherein the composition has a viscosity of 0.01 Pas to 1 Pas.

10. The prepolymer composition according to claim 1, wherein an additive containing silicone or fluoride selected from the group consisting of monomer or polyfunctional polydimethylsiloxane (meth)acrylates, perfluoro-n-alkyl (meth) acrylates or perfluoropolyether (meth) acrylates in a quantity of 0.1 wt % to 3 wt % is a surface-active anti-adhesive additive.

11. The prepolymer composition according to claim 1, wherein the composition is used as an embossing lacquer, and wherein the hardened prepolymer composition has a modulus of elasticity between 50 MPa and 5 GPa.

12. The prepolymer composition according to claim 11, wherein the embossing lacquer has a surface energy of 10 $mJ/m^2$ to 60 $mJ/m^2$.

13. The prepolymer composition according to claim 11 for manufacturing self-moldable embossing stamps for UV imprinting largely identical types of polymers.

14. The prepolymer composition according to claim 11, wherein the composition is used for continual structuring and in situ UV hardening in a roll-to-roll imprint process.

15. The prepolymer composition according to claim 5, wherein the photoinitiator is contained in a quantity of 0.5wt % to 5 wt %.

16. The prepolymer composition according to claim 7, wherein the reactive thinner is HDDA or TMP(EO)xTA.

17. The prepolymer composition according to claim 8, wherein the multifunctional aliphatic or polyether(meth) acrylate is TMP(EO)$_9$TA, TMP(EO)6TA, TMP(EO)$_3$TA or TMPTA.

* * * * *